United States Patent [19]
Briner

[11] Patent Number: 5,867,042
[45] Date of Patent: *Feb. 2, 1999

[54] SWITCH FOR MINIMIZING TRANSISTOR EXPOSURE TO HIGH VOLTAGE

[75] Inventor: Michael S. Briner, San Jose, Calif.

[73] Assignee: Micron Technology, Inc., Santa Clara, Calif.

[*] Notice: The term of this patent shall not extend beyond the expiration date of Pat. No. 5,619,150.

[21] Appl. No.: 835,763

[22] Filed: Apr. 8, 1997

Related U.S. Application Data

[63] Continuation of Ser. No. 499,304, Jul. 7, 1995, Pat. No. 5,619,150.
[51] Int. Cl.[6] .................. H03K 3/356; H03K 19/0185
[52] U.S. Cl. ..................... 327/55; 327/215; 327/434; 365/189.11
[58] Field of Search ............... 327/55, 57, 215, 327/219, 206, 434; 365/156, 189.11

[56] References Cited

U.S. PATENT DOCUMENTS

| | | | |
|---|---|---|---|
| 4,689,504 | 8/1987 | Raghunathan et al. | 326/81 |
| 4,973,864 | 11/1990 | Nogami | 327/55 |
| 5,130,581 | 7/1992 | Oh et al. | 327/55 |
| 5,136,190 | 8/1992 | Chern et al. | 327/215 |
| 5,243,236 | 9/1993 | McDaniel | 326/68 |
| 5,399,928 | 3/1995 | Lin et al. | 327/434 |
| 5,406,141 | 4/1995 | Yero et al. | 326/68 |
| 5,526,314 | 6/1996 | Kumar | 327/57 |
| 5,539,334 | 7/1996 | Clapp, III et al. | 326/68 |
| 5,559,464 | 9/1996 | Orii et al. | 327/333 |

Primary Examiner—Timothy P. Callahan
Assistant Examiner—Terry L. Englund
Attorney, Agent, or Firm—Schwegman, Lundberg, Woessner & Kluth, P.A.

[57] ABSTRACT

An asymmetric switch which minimizes transistor exposure to high voltage includes one pair of P-channel transistors with both N-wells coupled back to the programming voltage source and one pair of P-channel transistors with independent N-wells. Two pairs of N-channel transistors and an inverting circuit are also included to provide complementary input voltages to the switch. The P-channel and N-channel transistors used as guard devices may be biased by the same voltage or separate voltages.

16 Claims, 5 Drawing Sheets

SWITCH FOR MINIMIZING TRANSISTOR EXPOSURE TO HIGH VOLTAGE

This application is a continuation of U.S. patent application Ser. No. 08/499,304, filed Jul. 7, 1995, now U.S. Pat. No. 5,619,150, issued Apr. 8, 1997.

FIELD OF THE INVENTION

The present invention pertains generally to the field of electrically programmable and electrically erasable read-only memories, and more particularly to electronic switches which minimize transistor exposure to high voltage.

BACKGROUND OF THE INVENTION

The power and flexibility of personal computers has grown tremendously in terms of their use in many areas. Personal computers typically contain a microprocessor chip, random access memory and non-volatile memory provided by semi-conductor memory chips. Non-volatile memory retains previously stored information within the memory even when power is removed from the chip. One type of non-volatile memory, which will be referred to as flash memory, uses floating gate technology and may be electrically erased rather than erased by an external energy source such as ultraviolet light. Flash memories may also be programmed electrically by using a high-voltage programming current.

Flash memories have used complementary metal-oxide semiconductor (CMOS) level-shifting circuits to switch to the high voltage required for programming operations. In a typical flash memory, the high voltage required for programming operations is controlled by 5-volt logic signals. These signals require a level-shifting circuit for switching to the higher voltages needed for programming, normally in the range of 10 to 13 volts. A typical level-shifting circuit for CMOS devices is shown in FIG. 1. The circuit is symmetrical, comprising a cascode configured pairs of P-channel and N-channel transistors. A cascode configuration is normally used to avoid snapback problems with metal-oxide semiconductor field effect transistors (MOSFET), such as transistors 10, 12, 14 and 16, during high voltage switching. A disadvantage to this type of circuit is that one of the P-channel transistors, either 18 or 20, is coupled to Vss (ground) at its drain when their respective NMOS transistors are conducting, which results in a high reverse bias voltage (Vpp) on the drain to N-well junction. Another disadvantage is that one of the P-channel devices, either 14 or 16, is coupled to high voltage (Vpp) across its gate oxide while the device is activated, which may result in the deterioration and failure of the flash memory over time.

FIG. 2 illustrates a second known circuit which includes transistors 30 and 34 having their respective N-wells coupled to their sources. This approach limits the drain to N-well junction voltage to a level corresponding to a bias voltage (Vpt) minus the threshold voltage of the P-channel transistor. While this approach does limit the drain to N-well voltage on the P-channel transistors, one of the P-channel devices, either 32 or 36 depending on which of the devices is activated, still experiences a "Vpp" voltage differential across its gate oxide. As a result, the risk of deterioration and failure of the flash memory still exists.

Therefore, a need exists for a level-shifting switch which minimizes P-channel transistor exposure to high voltages on drain to N-well junctions and gate oxides, particularly in switching applications where the switch is known to be in one of its two logic states for most of the time.

SUMMARY OF THE INVENTION

In accordance with the principles of the present invention, an asymmetric switch arranged to minimize transistor exposure to high voltage is provided. The switch, in a particular embodiment, comprises a pair of P-channel transistors with both N-wells coupled back to the programming voltage source and a pair of P-channel transistors with independent N-wells. Two pairs of N-channel transistors and an inverting circuit provide complementary input voltages to the switch. The P-channel and N-channel transistors may be biased by the same voltage or separate voltages.

In one embodiment, the present invention comprises: first and second P-channel MOSFETs in cascode connection with the first P-channel MOSFET source and first and second P-channel MOSFET N-wells being coupled to a first voltage; third and fourth P-channel MOSFETs in serial connection having independent N-wells, with the third P-channel MOSFET source being coupled to the first voltage and the gates of the second and fourth P-channel MOSFETs being coupled to a second voltage; the first P-channel gate being coupled to the fourth P-channel MOSFET source, and the third P-channel MOSFET gate being coupled to the second P-channel MOSFET drain forming an output line; and first, second, third, and fourth N-channel MOSFETs, the first and second N-channel MOSFETs being in serial connection with the output line, the third and fourth N-channel MOSFETs being in serial connection with the fourth P-channel MOSFET drain, the gates of the second and fourth N-channel MOSFETs being coupled to the second voltage, and the gates of the first and third N-channel MOSFETs being coupled to receive complementary input signals.

The above summary of the present invention is not intended to present each embodiment or every aspect of the present invention. This is the purpose of the figures and the associated description which follow.

BRIEF DESCRIPTION OF THE DRAWINGS

Other aspects and advantages of the present invention will become apparent upon reading the following detailed description and upon reference to the drawings described below.

Figure 1:
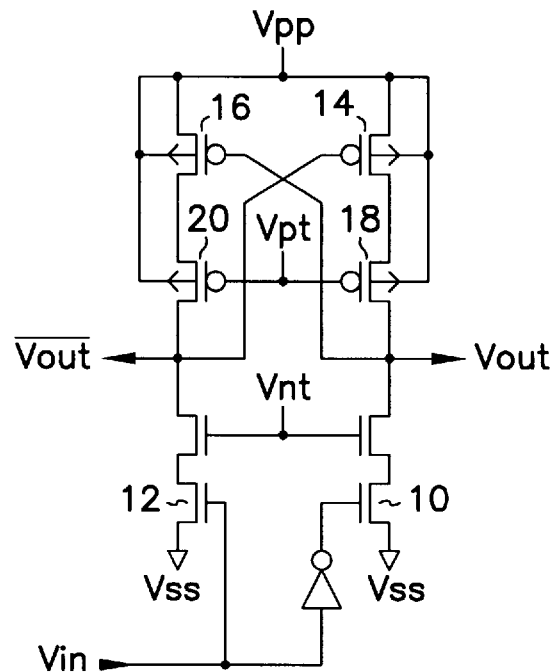
FIG. 1 is a schematic diagram of a previously known switch for shifting between high voltage levels in a flash memory.
Figure 2:
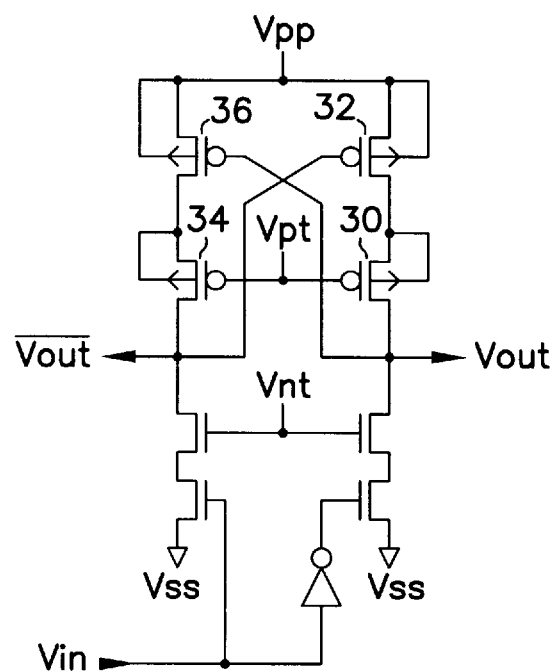
FIG. 2 is a schematic diagram of another previously known switch for shifting between high voltage levels in a flash memory.

While the invention is susceptible to various modifications and alternate forms, specifics thereof have been shown by way of examples in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE DRAWINGS

Figure 3:
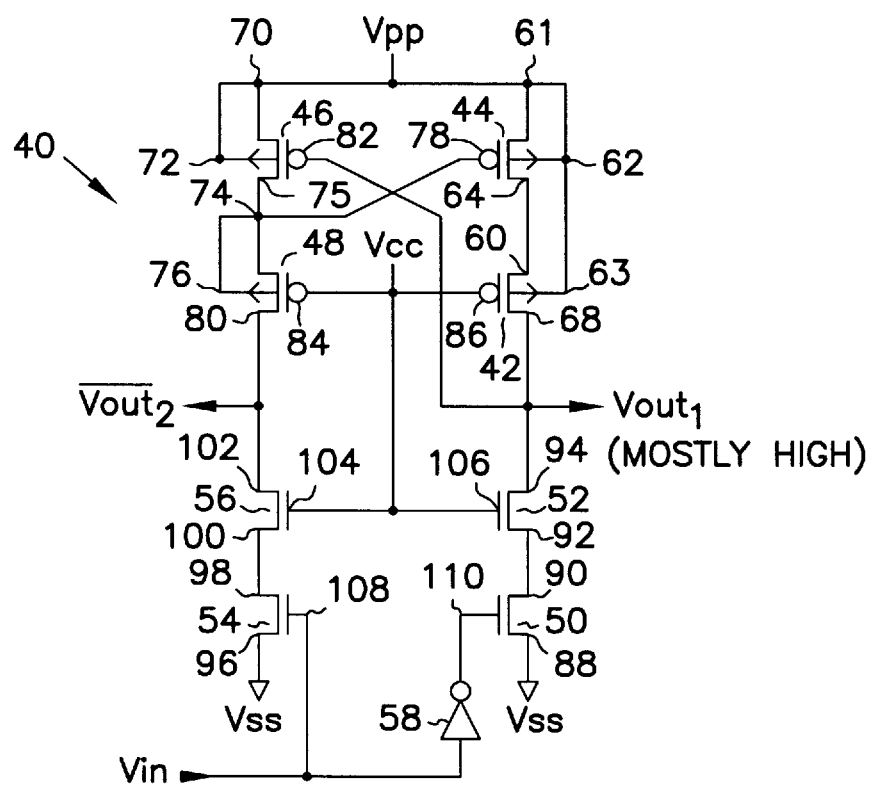
FIG. 3 is a schematic diagram of an asymmetric switch in accordance with the present invention, where $Vout_1$ is at Vss (ground) during memory programming.
Figure 4:
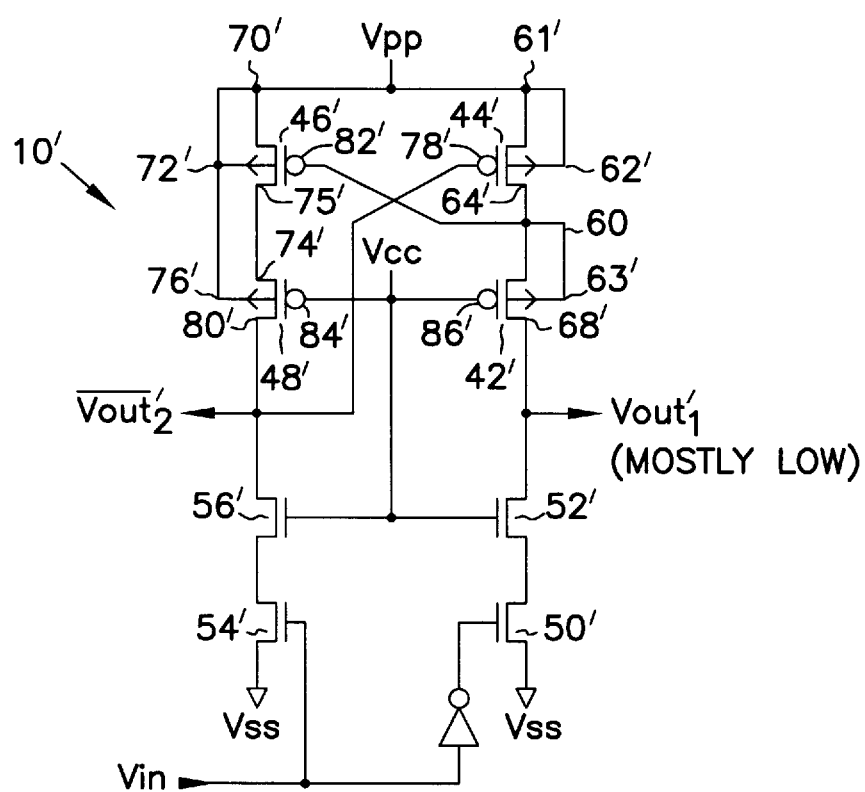
FIG. 4 is a schematic diagram of an asymmetric switch in accordance with the present invention, where Vout is at Vpp during memory programming.
Figure 5:
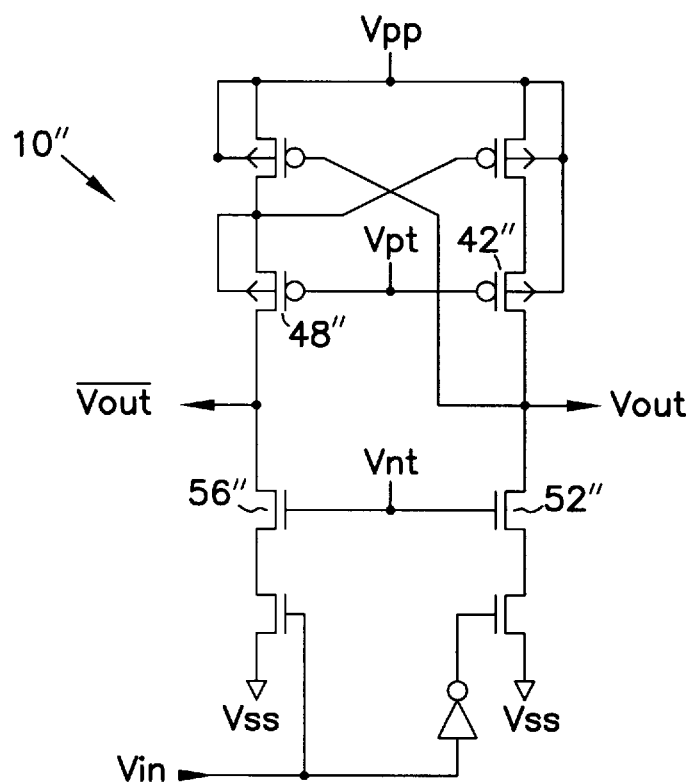
FIG. 5 is a schematic diagram of an asymmetric switch in accordance with the present invention, using Vpt and Vnt bias voltages.

The present invention has application in connection with non-volatile electrically erasable, programmable memory chips. Examples of such memories include EPROMs, flash EPROMs, EEPROMs, and other integrated circuits where high voltage switching is required. Preferred circuits depicted in FIGS. 3–5 show an exemplary arrangement and use an asymmetric circuit, for specific application to flash memories, in accordance with the present invention. Thus, while the potential applications of the present invention are not so limited, these circuits are discussed in this context.

Each of the circuits shown in FIGS. 3–5 includes an asymmetric CMOS N-well switching circuit which is arranged to minimize transistor exposure time to high voltages on gate and drain. In flash memory applications, the voltage used for programming operations (Vpp) is a relatively high voltage, typically in the range of 10 to 13 volts, while the voltage used for normal or standard operation (Vcc) is typically in the range of 3 to 6 volts. A flash memory may have the high voltage for programming (Vpp) applied for the lifetime of the flash memory. In certain applications, the lifetime of the flash memory can be as long as 20 years. The actual programming time, however, may be only 0.1 to 0.2 years (three million write cycles at two seconds/cycle equals 69 days). By properly matching the asymmetry of the circuits shown in FIGS. 3–5 with the logic levels of the programming signals, the transistors contained therein are only exposed to the high voltage programming power supply (Vpp) during the actual programming time, thereby reducing the time that the transistors experience high voltage stress by about two orders of magnitude. As a result, the risk of deterioration and/or failure of the flash memory is significantly minimized.

FIG. 3 illustrates a preferred embodiment of an asymmetric CMOS switch in accordance with the present invention. Switch 40 comprises two pairs of P-channel metal-oxide field effect transistors (MOSFETs) 42, 44, 46 and 48, two pairs of N-channel MOSFETs 50, 52, 54 and 56, and an inverting circuit 58. In particular, MOSFETs 42 and 44 are connected such that their sources 60 and 61 are coupled in cascode fashion to a programming voltage Vpp. Their N-wells 62 and 63 are connected to Vpp. The drain 64 of MOSFET 44 is coupled to the source 60 of MOSFET 42, while the drain 68 of MOSFET 42 is coupled to the output line Vout$_1$. MOSFETs 46 and 48 are connected such that MOSFET 46 has both its source 70 and N-well 72 coupled to the programming voltage Vpp, while MOSFET 48 has its source 74 and N-well 76 coupled to the drain 75 of MOSFET 46 and the gate 78 of MOSFET 44. The drain 80 of MOSFET 48 is coupled to the output line Vout$_2$, and the gate 82 of MOSFET 46 is coupled to the output line Vout$_1$, and the drain 68 of MOSFET 42. The gates 84 and 86 of MOSFET 48 and MOSFET 42, respectively are coupled to each other and to a voltage Vcc. Because the two N-wells of MOSFETs 46 and 48 are independently formed, each N-well can be individually biased.

The N-channel MOSFETs 50 and 52 are connected such that MOSFET 50 has its source 88 coupled to ground (Vss), and its drain 90 coupled to the source 92 of MOSFET 52. The drain 94 of MOSFET 52 is coupled to Vout$_1$ at the drain 68 of MOSFET 42 and the gate 82 of MOSFET 46. MOSFET 54 has its source 96 coupled to Vss and its drain 98 coupled to the source 100 of MOSFET 56. The drain 102 of MOSFET 56 is coupled to Vout$_2$ at the drain 80 of MOSFET 48. The gates 104 and 106 of MOSFETS 56 and 52, respectively, are coupled to each other, to the gates 84 and 86 of MOSFETS 48 and 42, respectively, and the voltage Vcc. The gate 108 of MOSFET 54 is coupled to input voltage Vin, while the gate 110 of MOSFET 50 is coupled to the input voltage Vin passed through inverting circuit 58. Therefore, gates 108 and 110 are coupled to receive complementary input signals (true and complement signals).

Transistors 42, 48, 52 and 56 act as guard devices for preventing the problem of snapback in MOSFETs 44, 46, 50 and 54 during the high voltage switching of the outputs, Vout$_1$ and Vout$_2$. Snapback is a potentially destructive phenomenon in MOSFET devices which occurs when the device is switched from a non-conducting OFF state to a conducting ON state while excessively high drain to source voltage is applied. This snapback situation is the result of turning on the parallel parasitic bipolar transistor formed by the source as the emitter, the body as the base (substrate for the N-channel devices and N-well for the P-channel devices), and the drain as the collector. MOSFETs 42, 48, 52 and 56 guard against snapback by preventing the drain-to-source voltages on the other transistors from becoming excessively high.

When the input voltage Vin is low, MOSFET 54 is OFF and the inverted signal of Vin, a Vcc voltage level, is applied to MOSFET 50 which is ON. Since MOSFETs 50 and 52 are ON, Vout$_1$ is at Vss and MOSFET 46 is ON which charges node 74 to Vpp. The node Vout$_2$ is charged to Vpp as well through MOSFET 48. Under these conditions, MOSFET 46 has Vpp voltage on its source 70, N-well 72 and drain 75. It has Vss on its gate 82. During this time, MOSFET 46 has Vpp voltage across its gate oxide. MOSFET 48 with Vcc on its gate 84, has Vpp on its source 74, N-well 76, and drain 80. MOSFET 56 with Vcc on its gate 104, has Vpp on its drain 102 and (Vcc less one N-channel Vt) on its source 100. MOSFET 54 with Vin on its gate 108 has (Vcc less one N-channel Vt) on its drain 98 and Vss on its source 96. MOSFET 44 with Vpp on its gate 78, source 61 and N-well 62 has (Vcc less one P-channel Vt) on its drain 64. Note that the P-channel Vt is a negative number, therefore (Vcc less one P-channel Vt) is a voltage more positive than Vcc. MOSFET 42 with Vcc on its gate 86 has (Vcc less one P-channel Vt) on its source 60, Vpp on its N-well 63 and Vout$_1$ which is at Vss on its drain 68. MOSFET 52 with Vcc on its gate 106 has Vss on its drain 94 and source 92. Under these conditions, the transistors which have the high voltage stress of full Vpp voltage are MOSFET 46 with Vss on its gate 82 and Vpp on its other nodes and MOSFET 42 which has Vss on its drain 68 and Vpp on its N-well 63. All the other transistors in the circuit have voltage differences much less than the full Vpp voltage level between their nodes.

When the input voltage Vin is switched to a high, Vcc voltage level, MOSFET 54 is ON and the inverted signal of Vin, a Vss voltage level, is applied to MOSFET 50 which is OFF. Under this condition, MOSFETs 54 and 56 are ON and Vout$_2$ is pulled toward Vss. MOSFET 48 with Vcc on its gate 84 and Vss on its drain 80 will pull its source 74 to Vcc less one P-channel Vt. This turns MOSFET 44 ON which then pulls its drain 64 to Vpp. This then pulls Vout$_1$ to Vpp through MOSFET 42. Since MOSFET 50 is OFF, MOSFET 52 pulls its source 92 to Vcc less one N-channel Vt. With these biases, MOSFET 42 has the highest gate voltage stress with Vcc on its gate 86 and Vpp on its source 60 N-well 63 and drain 68. MOSFET 46 with Vpp on its gate 82 source 70 and N-well 72 has its drain 75 at (Vcc less one P-channel Vt). MOSFET 48 with its gate 84 at Vcc has its source 74 at (Vcc less one P-channel Vt).

Typically, the logic of switch 40 requires that Vout$_1$ be at Vss during memory programming, such as during erase and write operations. During such operations, the MOSFET 46 receives Vpp voltage across its gate 82, while the MOSFET 44 receives Vss on its drain 64, and Vpp voltage on its N-well 62. However, since flash memories typically are only involved in programming operations for about one percent (1%) of their operating lifetime, the exposure of MOSFETs 44 and 46 to the high voltage Vpp is a relatively small portion. As a result, the disadvantages associated with transistor exposure to high voltages is minimized.

During all other memory operations, Vout$_1$ is at Vpp. As a result, during such operations, the MOSFET 48 has its drain 80 at Vss and its source 74 and N-well 76 at Vcc, minus one P-channel threshold. Concurrently, MOSFET 44 receives a voltage, Vpp, minus a quantity represented by the difference between Vcc and one P-channel threshold across its gate 78, and receives a voltage Vpp on its source 61, drain 64 and N-well 62. MOSFET 42 has Vcc on its gate 86 and Vpp on its source 60, drain 68 and N-well 63. MOSFET 46 receives Vpp on its gate 82, source 70 and N-well 72, and receives the voltage Vcc minus one P-channel threshold on its drain 75. With these bias conditions, none of the MOSFETs are exposed to the extreme high voltage difference of Vpp to Vss across any of its terminals. The maximum voltage seen across the terminals of any of the devices is Vpp minus Vcc. This is extremely important since the flash memory is involved in such operations for about ninety-nine percent (99%) of its lifetime. By reducing the stress on these MOSFETs, their lifespans are significantly increased.

FIG. 4 shows another embodiment in accordance with the present invention suited for a switch 10' having logic requiring that the Vout$_1$' signal be at Vpp during programming operations. MOSFET 44' has both the source 61' and N-well 62' coupled to the programming voltage Vpp, while the source 60' and N-well 63' of MOSFET 42' are coupled to the drain 64' of MOSFET 44' and the gate 82' of MOSFET 46'. The drain 68' of MOSFET 42' is coupled to the output line Vout$_1$'. The gates 86' and 84' of MOSFET 42' and MOSFET 48' are coupled to each other and to the voltage Vcc. The source 70' and N-well 72' of MOSFET 46' and N-well 76' of MOSFET 48' are coupled to the programming voltage Vpp. The drain 75' of MOSFET 46' is coupled to the source 74' of MOSFET 48', while the drain 80' of MOSFET 48' is coupled to the output line Vout$_2$'. The gate 78' of MOSFET 44' is also coupled to the drain 80' of MOSFET 48' at Vout$_2$'. The N-channel MOSFETs 50', 52', 54', and 56' are arranged in a similar manner as described with respect to FIG. 3.

FIG. 5 shows a modification to the embodiment described in FIG. 3. Unlike the switch 10 of FIG. 3, switch 10" of FIG. 5 uses a P-channel transistor bias voltage Vpt to bias MOSFETs 42" and 48", and a N-channel transistor bias voltage Vnt to bias MOSFETS 52" and 56". Bias voltages Vpt and Vnt are preferably equal and at Vcc so that the number of voltage supply lines routed to the circuitry is minimized. However, it can be understood by those skilled in the art that bias voltages Vpt and Vnt may also be set in a range between Vss and Vpp. When this is done, the voltages may be selected to minimize the stresses seen by the P-channel and N-channel devices independently from each other.

Figure 6:
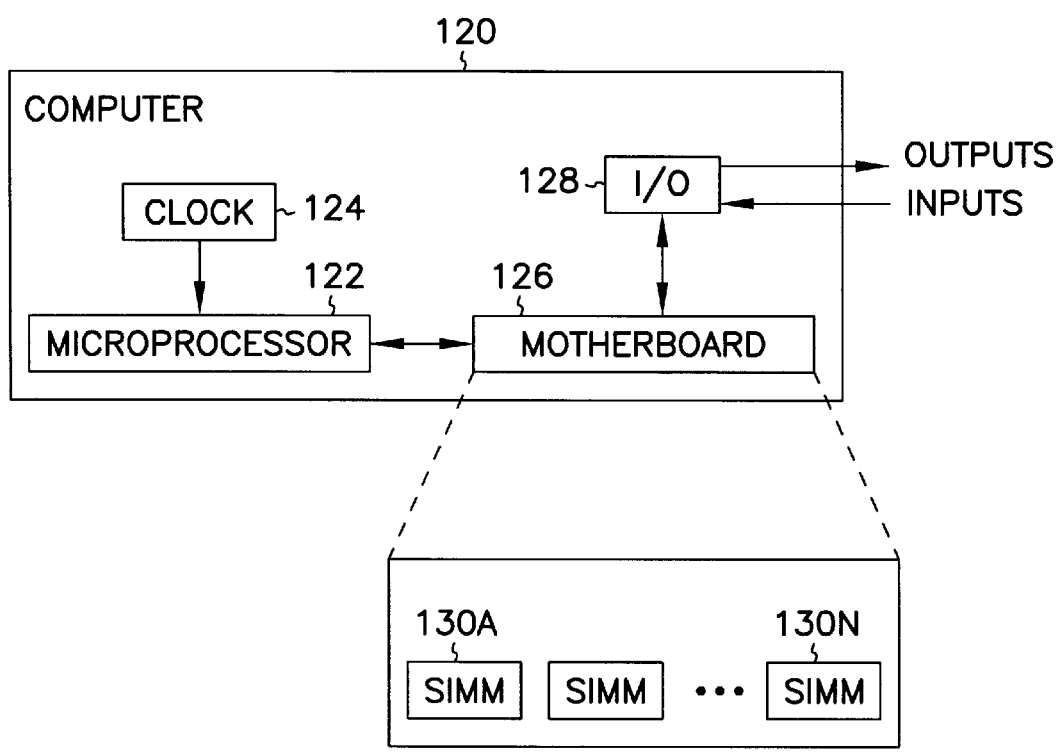
FIG. 6 is a block diagram of an exemplary computer with a memory which may use the present invention.

FIG. 6 is a block diagram of a computer 120 that includes a memory which may use the present invention. The computer 120 includes a microprocessor 122 and corresponding clock 124. The microprocessor 122 contains the central processing unit (CPU) and associated control circuitry. The microprocessor 122 is connected to a motherboard 126. An I/O interface module 128 is connected to the motherboard 126 and interfaces the microprocessor 122 with peripheral devices such as a monitor and printer. The motherboard 126 also contains a plurality of memory modules for storing data, such as single in-line memory modules (SIMMs) 130A–130N. The motherboard 126 is typically implemented with a printed circuit board, and the SIMMs 130A–130N are typically implemented with integrated circuit packages which "plug into" the motherboard 126. The circuits shown in FIG. 3–5 may also be implemented in an integrated circuit package within the computer 120, such as within the memory modules for use in programming the memories. A non-volatile memory is usually used on the motherboard 126, SIMMs 130A–130N, or through the I/O interface module 128.

The foregoing description, which has been disclosed by way of the above examples and discussion, addresses preferred embodiments of the present invention encompassing the principles of the present invention. The embodiments may be changed, modified, or implemented using various circuit types and arrangements. For example, the P-channel and N-channel circuits for reducing current flow across the transistor may be implemented using various forms of active or passive circuits. Those skilled in the art will readily recognize that these and various other modifications and changes may be made to the present invention without strictly following the exemplary embodiments and applications illustrated and described herein, and without departing from the true spirit and scope of the present invention which is set forth in the following claims.

What is claimed is:

1. A level switching circuit comprising:

a first switch including first, second, third, and fourth P-channel MOSFETs, wherein the first and second P-channel MOSFETs are serially connected and the first P-channel MOSFET source is coupled to a first voltage, wherein the third and fourth P-channel MOSFETs are serially connected and the third P-channel MOSFET source is coupled to the first voltage, and wherein the gates of the second and fourth P-channel MOSFETs are coupled to a second voltage, the third P-channel MOSFET gate is coupled to the second P-channel MOSFET source, the first P-channel MOSFET gate is coupled to the fourth P-channel MOSFET drain forming a first output, and the second P-channel MOSFET drain forms a second output; and a second switch coupled to the first and second outputs and responsive to complementary input signals to couple one of the first and second outputs to a third voltage potential and not couple the other of the first and second outputs to the third voltage potential to permit the other of the first and second outputs to be supplied by the first switch.

2. The level switching circuit of claim 1 wherein the first and second P-channel MOSFETs have independent N-wells, with first P-channel MOSFET N-well being coupled to the first voltage and the second P-channel MOSFET N-well being coupled to the first P-channel MOSFET drain, and wherein the third and fourth P-channel MOSFETs have N-wells coupled to the first voltage.

3. The level switching circuit of claim 1 wherein the second switch comprises:

first, second, third, and fourth N-channel MOSFETs, the first and second N-channel MOSFETs being in serial connection with the second P-channel MOSFET drain, the third and fourth N-channel MOSFETs being in serial connection with the fourth P-channel MOSFET drain, the gates of the second and fourth N-channel MOSFETs being coupled to a fourth voltage, and the gates of the first and third N-channel MOSFETs being coupled to receive the complementary input signals.

4. The level switching circuit of claim 3 wherein the second and the fourth voltages are the same voltage level.

5. The level switching circuit of claim 1 wherein the third voltage potential is a ground potential.

6. The level switching circuit of claim 1 wherein the first voltage is in a range of approximately ten to thirteen volts and the second voltage is in a range of approximately three to five volts.

7. A level switching circuit comprising:
   a first switch including first, second, third, and fourth P-channel MOSFETs, wherein the first and second P-channel MOSFETs are serially connected and the first P-channel MOSFET source is coupled to a first voltage, wherein the third and fourth P-channel MOSFETs are serially connected and the third P-channel MOSFET source is coupled to the first voltage, wherein the gates of the second and fourth P-channel MOSFETs are coupled to a second voltage, wherein the fourth P-channel MOSFET drain forms a first output and the second P-channel MOSFET drain forms a second output, wherein the first and second P-channel MOSFETs have independent N-wells, with first P-channel MOSFET N-well being coupled to the first voltage and the second P-channel MOSFET N-well being coupled to the first P-channel MOSFET drain, and wherein the third and fourth P-channel MOSFETs have N-wells coupled to the first voltage; and
   a second switch coupled to the first and second outputs and responsive to complementary input signals to couple one of the first and second outputs to a third voltage potential and not couple the other of the first and second outputs to the third voltage potential to permit the other of the first and second outputs to be supplied by the first switch.

8. The level switching circuit of claim 7 wherein the third P-channel MOSFET gate is coupled to the second P-channel MOSFET source and the first P-channel MOSFET gate is coupled to the fourth P-channel MOSFET drain.

9. The level switching circuit of claim 7 wherein the second switch comprises:
   first, second, third, and fourth N-channel MOSFETs, the first and second N-channel MOSFETs being in serial connection with the second P-channel MOSFET drain, the third and fourth N-channel MOSFETs being in serial connection with the fourth P-channel MOSFET drain, the gates of the second and fourth N-channel MOSFETs being coupled to a fourth voltage, and the gates of the first and third N-channel MOSFETs being coupled to receive the complementary input signals.

10. The level switching circuit of claim 9 wherein the second and the fourth voltages are the same voltage level.

11. The level switching circuit of claim 7 wherein the third voltage potential is a ground potential.

12. The level switching circuit of claim 7 wherein the first voltage is in a range of approximately ten to thirteen volts and the second voltage is in a range of approximately three to five volts.

13. A method of minimizing transistor exposure to high voltage in an integrated circuit including a first switch having first, second, third, and fourth P-channel MOSFETs, wherein the first and second P-channel MOSFETs are serially connected and the first P-channel MOSFET source is coupled to a first voltage, wherein the third and fourth P-channel MOSFETs are serially connected and the third P-channel MOSFET source is coupled to the first voltage, wherein the gates of the second and fourth P-channel MOSFETs are coupled to a second voltage, wherein the fourth P-channel MOSFET drain forms a first output and the second P-channel MOSFET drain forms a second output, the method comprising the steps of:
   responding to complementary input signals to couple the first output to a third voltage potential and the second output to the first voltage through the first switch during a programming operation of the integrated circuit;
   responding to the complementary input signals to couple the second output to the third voltage potential and the first output to the first voltage through the first switch during a non-programming operation of the integrated circuit; and
   maintaining all voltage differentials across the first, second, third, and fourth P-channel MOSFET's gate oxides at substantially less than the first voltage during the non-programming operation of the integrated circuit.

14. The method of claim 13 further comprising the step of:
   maintaining all drain to N-well junction voltages of the first, second, third, and fourth P-channel MOSFETs's at substantially less than the first voltage during the non-programming operation of the integrated circuit.

15. The method of claim 13 wherein the third voltage potential is a ground potential.

16. The method of claim 13 wherein the first voltage is in a range of approximately ten to thirteen volts and the second voltage is in a range of approximately three to five volts.

* * * * *